(12) United States Patent
Zhang

(10) Patent No.: US 8,884,376 B2
(45) Date of Patent: Nov. 11, 2014

(54) LARGE BIT-PER-CELL THREE-DIMENSIONAL MASK-PROGRAMMABLE READ-ONLY MEMORY

(71) Applicant: ChengDu HaiCun IP Technology LLC, SiChuan (CN)

(72) Inventor: Guobiao Zhang, Corvallis, OR (US)

(73) Assignees: ChengDu HaiCun Technology LLC, ChengDu, SiChuan (CN); Guobiao Zhang, Corvalis, OR (US)

( * ) Notice: Subject to any disclaimer, the term of this patent is extended or adjusted under 35 U.S.C. 154(b) by 0 days.

(21) Appl. No.: 14/028,504

(22) Filed: Sep. 16, 2013

(65) Prior Publication Data

US 2014/0015103 A1    Jan. 16, 2014

Related U.S. Application Data

(63) Continuation of application No. 12/785,621, filed on May 24, 2010, now Pat. No. 8,564,070.

(51) Int. Cl.
| | |
|---|---|
| H01L 29/76 | (2006.01) |
| H01L 49/02 | (2006.01) |
| G11C 17/10 | (2006.01) |
| H01L 27/112 | (2006.01) |
| H01L 29/868 | (2006.01) |

(52) U.S. Cl.
CPC ............... *H01L 28/20* (2013.01); *G11C 17/10* (2013.01); *H01L 27/112* (2013.01); *H01L 29/868* (2013.01)
USPC ................ 257/390; 257/E27.006; 257/529

(58) Field of Classification Search
USPC .................... 257/50, 209, 529–530
See application file for complete search history.

(56) References Cited

U.S. PATENT DOCUMENTS

| | | |
|---|---|---|
| 4,404,655 A | 9/1983 | Naiff |
| 4,424,579 A | 1/1984 | Roesner |
| 4,598,386 A | 7/1986 | Roesner |
| 4,603,341 A | 7/1986 | Bertin et al. |
| 4,796,074 A | 1/1989 | Roesner |
| 5,257,224 A | 10/1993 | Nojiri et al. |
| 5,272,370 A | 12/1993 | French |
| 5,455,435 A | 10/1995 | Fu et al. |
| 5,468,983 A | 11/1995 | Hirase et al. |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,049,481 A | 4/2000 | Yamasaki |
| 6,221,723 B1 | 4/2001 | Kunitou |
| 6,385,074 B1 | 5/2002 | Johnson et al. |

(Continued)

*Primary Examiner* — Matthew W Such
*Assistant Examiner* — Ali Naraghi

(57) ABSTRACT

A large bit-per-cell three-dimensional mask-programmable read-only memory (3D-MPROM$_B$) is disclosed. It can achieve large bit-per-cell (e.g. 4-bpc or more). 3D-MPROM$_B$ can be realized by adding resistive layer(s) or resistive element(s) to the memory cells.

10 Claims, 9 Drawing Sheets

(56) References Cited

U.S. PATENT DOCUMENTS

| | | |
|---|---|---|
| 6,420,215 B1 | 7/2002 | Knall et al. |
| 6,461,906 B1 | 10/2002 | Lung |
| 6,515,888 B2 | 2/2003 | Johnson et al. |
| 6,624,485 B2 | 9/2003 | Johnson |
| 6,646,913 B2 | 11/2003 | Micheloni et al. |
| 6,717,222 B2 * | 4/2004 | Zhang .......................... 257/390 |
| 6,794,253 B2 | 9/2004 | Lin et al. |
| 6,809,948 B2 | 10/2004 | Nachumovsky et al. |
| 6,816,407 B2 | 11/2004 | Rolandi |
| 6,821,841 B1 | 11/2004 | Wu et al. |
| 6,822,898 B2 | 11/2004 | Matsui |
| 6,853,028 B2 | 2/2005 | Kim et al. |
| 7,071,849 B2 | 7/2006 | Zhang |
| 7,167,109 B2 | 1/2007 | Hu et al. |
| 7,633,128 B2 * | 12/2009 | Zhang .......................... 257/390 |
| 2005/0050434 A1 | 3/2005 | Lunelli et al. |
| 2009/0237976 A1 | 9/2009 | Zhang |
| 2010/0177549 A1 * | 7/2010 | Herner ........................... 365/96 |

* cited by examiner

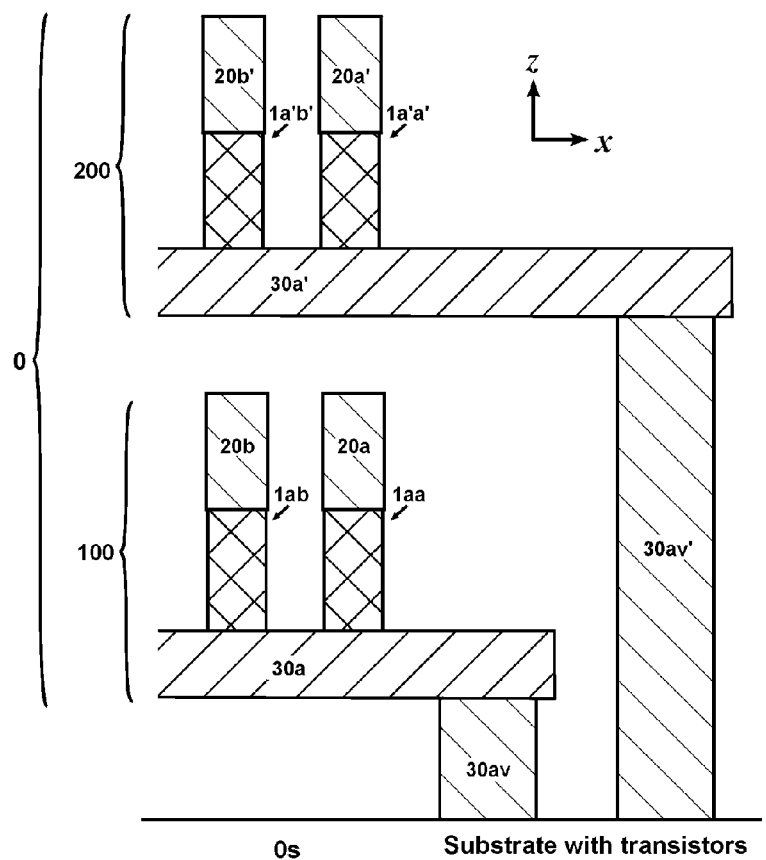
Fig. 1
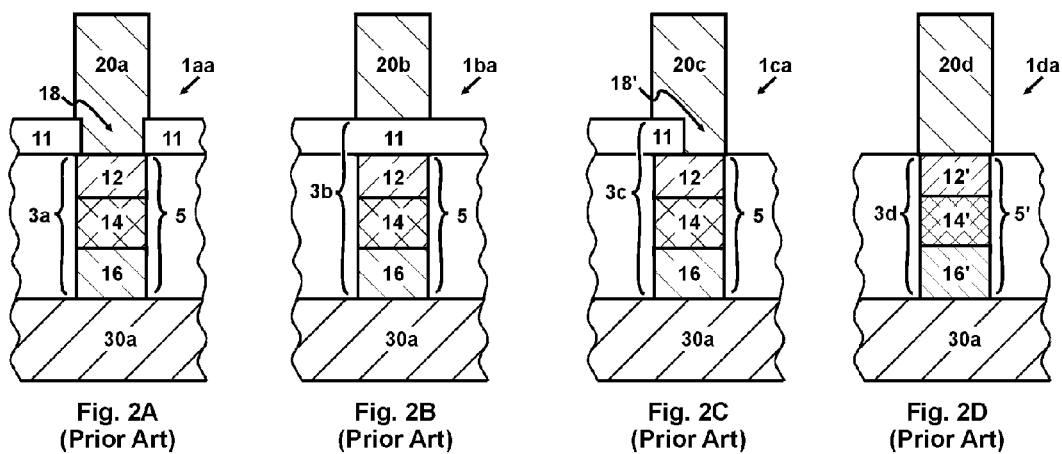
Fig. 2A
(Prior Art)
Fig. 2B
(Prior Art)
Fig. 2C
(Prior Art)
Fig. 2D
(Prior Art)

| Cell State | Upper Resistive Layer 23x | Middle Resistive Layer 23y | Lower Resistive Layer 23z | Resistive Element |
|---|---|---|---|---|
| '0' | No | No | No | No |
| '1' | No | No | No | Yes |
| '2' | No | No | Yes | No |
| '3' | No | No | Yes | Yes |
| '4' | No | Yes | No | No |
| '5' | No | Yes | No | Yes |
| '6' | No | Yes | Yes | No |
| '7' | No | Yes | Yes | Yes |
| '8' | Yes | No | No | No |
| '9' | Yes | No | No | Yes |
| 'a' | Yes | No | Yes | No |
| 'b' | Yes | No | Yes | Yes |
| 'c' | Yes | Yes | No | No |
| 'd' | Yes | Yes | No | Yes |
| 'e' | Yes | Yes | Yes | No |
| 'f' | Yes | Yes | Yes | Yes |

Fig. 15A

LARGE BIT-PER-CELL THREE-DIMENSIONAL MASK-PROGRAMMABLE READ-ONLY MEMORY

CROSS-REFERENCE TO RELATED APPLICATIONS

This application is a continuation of U.S. patent application Ser. No. 12/785,621, "Large Bit-Per-Cell Three-Dimensional Mask-Programmable Read-Only Memory", filed May 24, 2010.

BACKGROUND

1. Technical Field of the Invention

The present invention relates to the field of integrated circuits, and more particularly to mask-programmable read-only memory (mask-ROM).

2. Prior Arts

Mask-programmable read-only memory (mask-ROM) refers to those types of memories into which data are written during manufacturing, preferably during the lithographic steps. Three-dimensional mask-programmable read-only memory (3D-MPROM) is a mask-ROM comprising a plurality of mask-ROM levels stacked above and coupled to a semiconductor substrate. Among all types of mask-ROM, 3D-MPROM has a very large capacity and a very low cost.

U.S. Pat. No. 5,835,396, issued to Zhang on Nov. 10, 1998, and U.S. Pat. No. 6,624,485, issued to Johnson on Sep. 23, 2003, disclose examples of 3D-MPROM. FIG. 1 illustrates a typical 3D-MPROM. It comprises a semiconductor substrate 0s and a 3D-MPROM stack 0. The semiconductor substrate 0s comprises transistors, which form the peripheral circuit for 3D-MPROM. The 3D-MPROM stack 0 is stacked above the substrate 0s. In this example, it comprises two memory levels: 100 and 200; and the memory level 200 is stacked above the memory level 100. Each memory level (e.g. 100) comprises a plurality of address lines (e.g. 20a, 20b, 30a ...) and memory cells (e.g. 1aa, 1ab ...). Contact vias (e.g. 30av, 30av') couple memory levels (e.g. 100, 200) to the substrate 0s.

Most 3D-MPROM's disclosed in prior arts are binary, i.e. memory cells have two states: '1' and '0': state '1' conducts current, whereas state '0' does not. Each binary cell can store one bit of data.

As illustrated in FIG. 2A, a '1' 3D-MPROM cell 1aa comprises an upper address line 20a, a ROM-layer 3a and a lower address line 30a. The ROM-layer 3a comprises a quasi-conduction layer 5, which is a non-linear resistor and conducts more current in one direction than in the other direction. The quasi-conduction layer 5 is generally a diode. Here, it is a p-i-n diode, including a p-layer 12, an i-layer 14 and an n-layer 16. It could also be other diodes, such as p-n diode or Schottky diode. Because there is a contact 18 in the insulating dielectric 11, a read current can be sensed in the lower address line 30a when a read voltage is applied to the upper address line 20a. This corresponds to the state '1'.

As illustrated in FIG. 2B, a '0' 3D-MPROM cell 1ba comprises an upper address line 20b, a ROM-layer 3b and a lower address line 30a. The ROM-layer 3b further comprises an insulating dielectric 11. Because there is no contact in the insulating dielectric 11, no read current can be sensed in the lower address line 30a when a read voltage is applied to the upper address line 20b. This corresponds to the state '0'.

Besides binary, 3D-MPROM can be N-ary (N is a positive integer and N>2), i.e. memory cells have N states and cells in different states have different current-voltage (I-V) characteristics. Each N-ary cell can store b bits of data, namely b-bit-per-cell (bpc). Here, $b=\log_2(N)$ and b can be an integer or a non-integer. U.S. Pat. No. 7,633,128, issued to Zhang on Dec. 15, 2009, and U.S. patent application Ser. No. 12/477,912, filed by Zhang on Jun. 4, 2009, disclose examples of N-ary 3D-MPROM. They include geometry-defined N-ary 3D-MPROM and junction-defined N-ary 3D-MPROM.

In a geometry-defined N-ary 3D-MPROM, cells in different states have different structures, e.g. different cell geometries. As illustrated in FIG. 2C, a geometry-defined cell 1ca comprises an upper address line 20c, a ROM-layer 3c and a lower address line 30a. The ROM-layer 3c further comprises an insulating layer 11, a partial contact 18' and a quasi-conduction layer 5. Compared with FIG. 2A, the partial contact 18' in the insulating layer 11 only partially couples the upper address line 20c to the quasi-conduction layer 25. Accordingly, memory cell 1ca has a different I-V characteristic than memory cell 1aa.

In a junction-defined N-ary 3D-MPROM, cells in different states have different junctions, e.g. different doping profiles. As illustrated in FIG. 2D, a junction-defined cell 1da comprises an upper address line 20d, a ROM-layer 3d and a lower address line 30a. The ROM-layer 3d has a similar structure as the ROM-layer 3a in cell 1aa (FIG. 2A), but its diode 5' has a different doping profile than diode 5. This can be implemented by an extra implant. Accordingly, memory cell 1da has a different I-V characteristic than cell 1aa.

The present invention makes further improvements to N-ary 3D-MPROM. By increasing the range of modulation for the cell I-V characteristics (e.g. to ~4.5V or more), large bit-per-cell (e.g. 4-bpc) can be achieved. Accordingly, the present invention discloses a large bit-per-cell 3D-MPROM ($3D\text{-MPROM}_B$).

OBJECTS AND ADVANTAGES

It is a principle object of the present invention to increase the storage capacity of 3D-MPROM.

It is a further object of the present invention to lower the manufacturing cost of 3D-MPROM.

It is a further object of the present invention to achieve large bit-per-cell (e.g. 4-bpc or more) for 3D-MPROM.

In accordance with these and other objects of the present invention, a large bit-per-cell 3D-MPROM ($3D\text{-MPROM}_B$) is disclosed.

SUMMARY OF THE INVENTION

An improved N-ary (N>2) three-dimensional mask-programmable read-only memory (3D-MPROM), having large bit-per-cell (e.g. 4-bpc or more), is disclosed. The large bit-per-cell 3D-MPROM ($3D\text{-MPROM}_B$) increases the range of modulation for the cell I-V characteristics by adding resistive layer(s) and/or resistive element(s) to the memory cells. Accordingly, $3D\text{-MPROM}_B$ can be categorized into $3D\text{-MPROM}_B$ with resistive layer ($3D\text{-MPROM}_{RL}$) and $3D\text{-MPROM}_B$ with resistive element ($3D\text{-MPROM}_{RE}$).

A $3D\text{-MPROM}_{RL}$ comprises a first cell and a second cell. The first cell is a base cell, which has the smallest threshold voltage among all states. Here, threshold voltage ($V_T$) refers to the voltage on a memory cell that generates a threshold current ($I_T$) through the memory cell. The second cell has a larger $V_T$ than the base cell. Its memory cell comprises at least one resistive layer more than the base cell. The resistive layer could comprise a semiconductor layer (e.g. 45 nm amorphous silicon), or, a thin dielectric layer (e.g. 5 nm silicon oxide, or 9 nm silicon nitride). It preferably has a resistance comparable to or larger than the base cell at $I_T$. Resistive layer(s) can significantly modulate $V_T$. As a result, memory cells have a wide total $V_T$ window (TVW) and therefore, large bit-per-cell.

A 3D-MPROM$_{RE}$ comprises a first cell and a second cell. The first cell is a base cell; the second cell has a larger $V_T$ than the base cell. Its quasi-conduction layer comprises more concentration of at least one resistive element than the quasi-conduction layer of the base cell. The resistive element (e.g. oxygen, nitrogen or carbon), when introduced into the semi-conductor material (e.g. silicon) of the quasi-conductor layer (e.g. p-i-n diode) of the base cell, can increase its resistivity. In addition, more concentration of the resistive element leads to a higher resistivity. Resistive element(s) can also significantly modulate $V_T$. As a result, memory cells have a wide TVW and therefore, large bit-per-cell.

BRIEF DESCRIPTION OF THE DRAWINGS

FIG. 1 is a cross-sectional view of a three-dimensional mask-programmable read-only memory (3D-MPROM);

FIGS. 2A-2D are cross-sectional views of prior-art binary '1' 3D-MPROM cell, binary '0' 3D-MPROM cell, geometry-defined N-ary 3D-MPROM cell, and junction-defined N-ary 3D-MPROM cell;

FIG. 15A is a table listing the configuration for 16 states in a preferred 4-bpc 3D-MPROM$_B$ (b=4, N=16)

Figure 3:
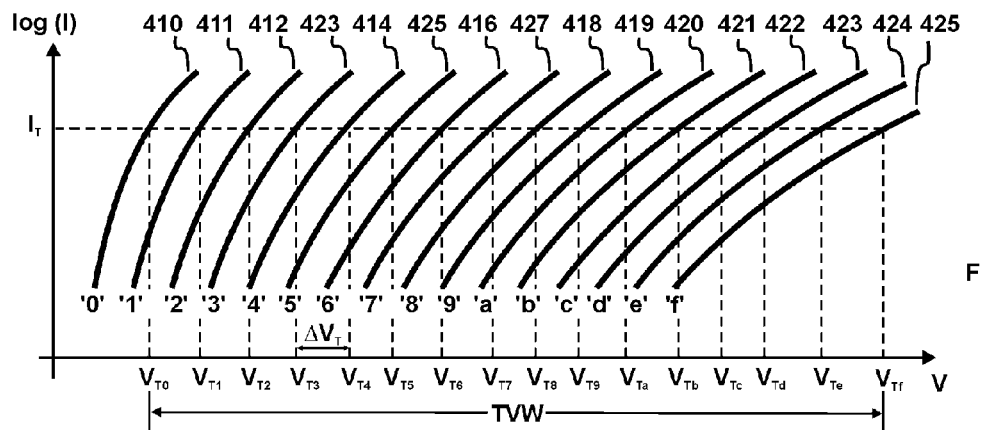
FIG. 3 illustrates the current-voltage (I-V) curves for 16 states of a preferred 4-bit-per-cell (bpc) 3D-MPROM$_B$ (b=4, N=16)

It should be noted that all the drawings except FIG. 15A are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

The present invention discloses a large bit-per-cell 3D-MPROM (3D-MPROM$_B$). Each 3D-MPROM$_B$ cell can store a large number of bits (e.g. 4 bits or more). FIG. 3 illustrates the cell current-voltage (I-V) curves for 16 states of a 4-bit-per-cell (bpc) 3D-MPROM$_B$ (b=4, N=16). The cell I-V curves 410-425 correspond to states '0'-'f', respectively. Note the vertical axis is on a log scale. A memory cell is considered "turned-on" when its current exceeds a threshold current ($I_T$). The cell voltage at $I_T$ is referred to as threshold voltage ($V_T$). For example, $V_T$ for state '0' is $V_{T0}$; $V_T$ for state 'f' is $V_{Tf}$. In this disclosure, the assignment of state values follows this convention: the cell with a smaller $V_T$ is assigned a lower state value, e.g. cells with the smallest $V_T$ is assigned state '0'; cells with the second smallest $V_T$ is assigned state '1'; . . . . It should be apparent to those skilled in the art that other conventions may also be followed.

To tolerate manufacturing variations and read tolerances, $\Delta V_T$ of the neighboring states generally needs to be ~0.3V or more. Hence, the total $V_T$ window (TVW), which is the difference between the largest $V_T$ (i.e. $V_{Tf}$) and the smallest $V_T$ (i.e. $V_{T0}$), generally needs to be ~4.5V or more. To realize this wide TVW, the present invention suggests adding resistive layer(s) and/or resistive element(s) to the memory cells. Accordingly, 3D-MPROM$_B$ can be categorized into 3D-MPROM$_B$ with resistive layer (3D-MPROM$_{RL}$) and 3D-MPROM$_B$ with resistive element (3D-MPROM$_{RE}$).

Figures 4A, 4B, 4C, 4D:
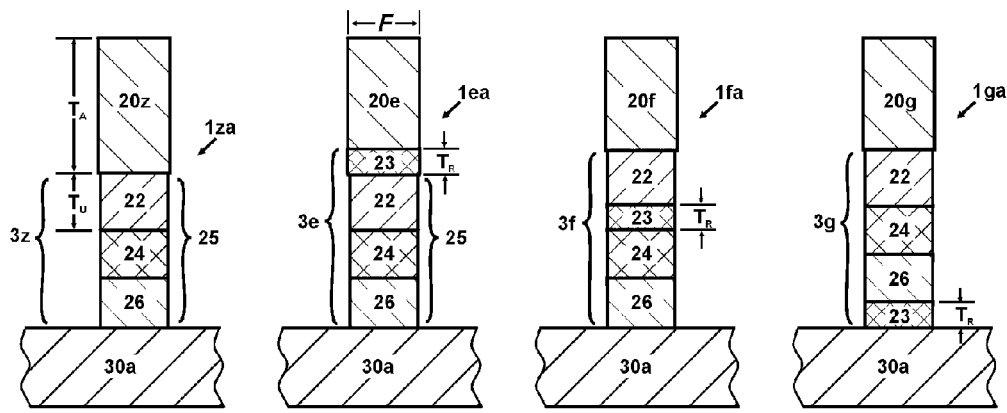
FIGS. 4A-4D are cross-sectional views of several preferred 3D-MPROM$_B$ cells with resistive layer (3D-MPROM$_{RL}$)

Examples of 3D-MPROM$_{RL}$ are illustrated in FIGS. 4A-9C. Among them, FIGS. 4A-4D illustrate several preferred 3D-MPROM$_{RL}$ cells. Referring now to FIG. 4A, a typical base cell 1za is illustrated. The base cell 1za has the smallest $V_T$ among all states, i.e. $V_{T0}$. It comprises a plurality of layers, including an upper address line 20z, the ROM-layer 3z and a lower address line 30a. These layers are collectively referred to as base layers. Among them, the address lines 20z, 30a comprise conductive material(s) such as highly-doped polysilicon, tungsten, titanium tungsten, titanium nitride, copper, or the like; the ROM-layer 3z only comprises a quasi-conduction layer 25, which is a non-linear resistor and conducts more current in one direction than in the other direction. The quasi-conduction layer 25 is generally a diode. Here, it is a p-i-n diode, including a p-layer 22, an i-layer 24 and an p-layer 26. More details on quasi-conduction layer are disclosed in U.S. Pat. No. 5,835,396.

Referring now to FIG. 4B, a first preferred 3D-MPROM$_{RL}$ cell 1ea is illustrated. It comprises an upper address line 20e, a ROM-layer 3e and a lower address line 30a. The address lines 20e, 30a comprise conductive material(s). The ROM-layer 3e comprises a resistive layer 23 in addition to the quasi-conduction layer 25 (including p-layer 22, i-layer 24 and n-layer 26). In this preferred embodiment, the resistive layer 23 is formed above the quasi-conduction layer 25. It preferably has a resistance comparable to or larger than the quasi-conduction layer 25 at $I_T$. Because the base cell 1za and the quasi-conduction layer 25 have the same I-V characteristics, the resistive layer 23 preferably has a resistance comparable to or larger than the base cell 1za at $I_T$.

FIG. 4C illustrates a second preferred 3D-MPROM$_{RL}$ cell 1fa. It comprises an upper address line 20f, a ROM-layer 3f and a lower address line 30a. The address lines 20f, 30a comprise conductive material(s). The ROM-layer 3f comprises a resistive layer 23 in addition to the quasi-conduction layer 25 (including p-layer 22, i-layer 24 and n-layer 26). In this preferred embodiment, the resistive layer 23 is formed in the quasi-conduction layer 25, i.e. between the uppermost p-layer 22 and the middle i-layer 24. It preferably has a resistance comparable to or larger than the base cell 1za at $I_T$.

FIG. 4D illustrates a third preferred 3D-MPROM$_{RL}$ cell 1ga. It comprises an upper address line 20g, a ROM-layer 3g and a lower address line 30a. The address lines 20g, 30a comprise conductive material(s). The ROM-layer 3g comprises a resistive layer 23 in addition to the quasi-conduction layer 25 (including p-layer 22, i-layer 24 and n-layer 26). In this preferred embodiment, the resistive layer 23 is formed below the quasi-conduction layer 25. It preferably has a resistance comparable to or larger than the base cell 1za at $I_T$.

To form a 3-D device structure, i.e. to stack multiple memory levels one above another, the 3D-MPROM$_{RL}$ cell (1ea/1fa/1ga, "/" here means "or") and the base cell 1za on a same memory level should provide a good foundation upon which the next memory level can be built. In other words, their upper address lines (20e/20f/20g, 20z) are preferably planarized (e.g. by chemical-mechanical polishing, or CMP). According, the thickness $T_R$ of the resistive layer 23 should satisfy the following requirements: 1) in the preferred embodiments of FIGS. 4C-4D, if the ROM-layers (3f/3g, 3z) are to be planarized, then $T_R$ should be less than the thickness $T_U$ of the uppermost layer 22 in the quasi-conduction layer 25 of the base cell 1za; 2) in the preferred embodiments of FIGS. 4B-4D, if the ROM-layers (3e/3f/3g, 3z) are not planarized, then $T_R$ should be less than the thickness $T_A$ of the upper address line 20z of the base cell 1za.

Figure 5:
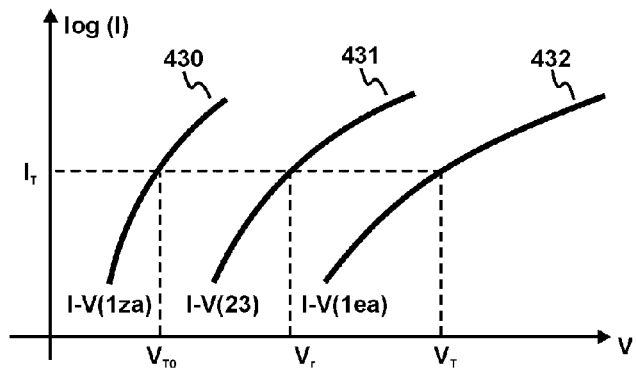
FIG. 5 compares the I-V curves for a base cell, a resistive layer, and a 3D-MPROM$_{RL}$ cell.

FIG. 5 compares the I-V curves 430, 431, 432 for a base cell 1za, a resistive layer 23 and a 3D-MPROM$_{RL}$ cell 1ea. Because the resistive layer 23 and quasi-conduction layer 25 are connected in series in the 3D-MPROM$_{RL}$ cell 1ea, the I-V curve 432 for the 3D-MPROM$_{RL}$ cell 1ea is shifted from the I-V curve 430 for the quasi-conduction layer 25 (or, the base cell 1za) by an amount indicated by the I-V curve 431 of the resistive layer 23. Hence, $V_T$ of the 3D-MPROM$_{RL}$ cell 1ea is the sum of $V_{T0}$ of the base cell 1za and the voltage $V_r$ on the resistive layer 23, i.e. $V_T = V_{T0} + V_r$.

Figure 6A:
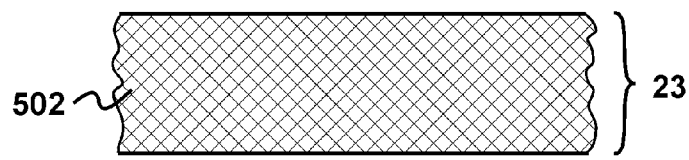
FIGS. 6A-6D are the cross-sectional views of four preferred resistive layers.

FIGS. 6A-6D are the cross-sectional views of several preferred resistive layers. FIG. 6A illustrates a preferred resistive layer 23. It comprises only a core resistive layer 502. The core resistive layer 502 has an exponential I-V characteristic as shown in FIG. 5. It comprises a semiconductor layer, or a thin dielectric layer. The semiconductor layer could comprise silicon, carbon, germanium, silicon carbide, silicon germanium or others. It preferably takes a non-single-crystalline form, e.g. amorphous, microcrystalline, or polycrystalline. One example of the semiconductor layer is 45 nm amorphous silicon, which can shift $V_T$ by ~4.5V or more. The thin dielectric layer could comprise silicon oxide, silicon nitride, or other protective ceramics (referring to U.S. Pat. No. 5,838, 530, issued to Zhang, on Nov. 17, 1998). Although it is traditionally considered as an insulator, dielectric has an exponential I-V characteristic when used in thin layer and therefore, is suitable for the resistive layer. Examples of the thin dielectric layer are 5 nm silicon oxide and 9 nm silicon nitride, either of which can shift $V_T$ by ~4.5V or more.

Figure 6B:
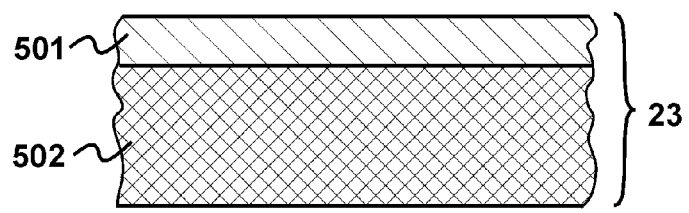
Figure 6C:
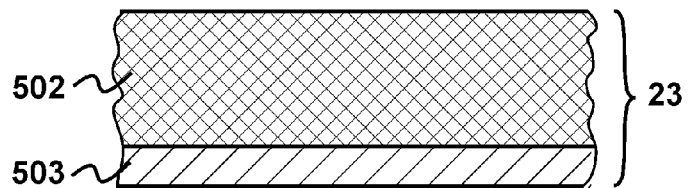
Figure 6D:
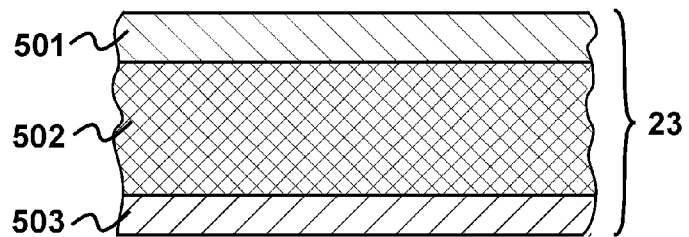

Referring now to FIGS. 6B-6D, three alternate preferred resistive layers 23 are illustrated. In FIG. 6B, a barrier layer 501 is formed above the core resistive layer 502; in FIG. 6C, a barrier layer 503 is formed below the core resistive layer 502; in FIG. 6D, barrier layers 501, 503 are formed above and below the core resistive layer 502, respectively. The barrier layer provides a better interface for the resistive layer 23 and can also be used as etch-stop layer. It comprises conductive material(s) such as highly-doped polysilicon, tungsten, titanium tungsten, titanium nitride, copper, or the like.

Figure 7:
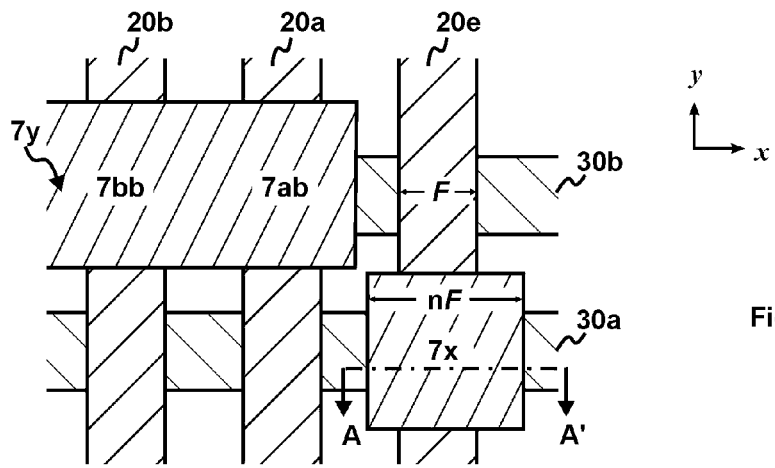
FIG. 7 is a plan view of a preferred resistive-layer mask for 3D-MPROM$_{RL}$, as well as the relative placement of the resistive layer and address lines during manufacturing.

FIG. 7 is a plan view of a preferred resistive-layer mask for 3D-MPROM$_{RL}$. It also illustrates the relative placement of the resistive-layer patterns 7x, 7y with respect to the upper address-line patterns 20a, 20b, 20e and the lower address-line patterns 30a, 30b. Compared with the upper address-line patterns whose critical dimension is 1F, the resistive-layer pattern 7x could have a large critical dimension, i.e. nF (n>1, preferably ~2). Moreover, adjacent resistive-layer patterns (e.g. 7ab, 7bb) can be merged into a larger single resistive-layer pattern 7y. Accordingly, the resistive-layer mask is an nF-mask (n>1, preferably ~2). For example, a 20 nm-node 3D-MPROM can use a 40 nm-node resistive-layer mask.

Figure 8A:
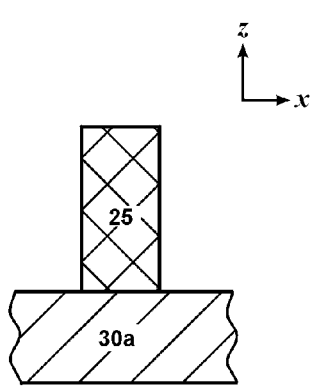
FIGS. 8A-8C are the cross-sectional views along line AA' of FIG. 7 showing several manufacturing steps of the preferred 3D-MPROM$_{RL}$ cell.
Figure 8B:
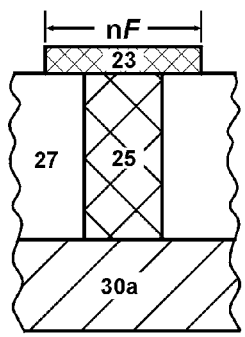
Figure 8C:
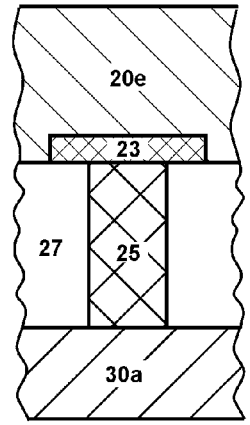

FIGS. 8A-8C illustrate several manufacturing steps of the preferred 3D-MPROM$_{RL}$ cell 1ea of FIG. 4B. First of all, the lower address-line 30a is formed. This is followed by the deposition of the quasi-conduction layer 25. The quasi-conduction layer 25 is then etched to form a plurality of individual pillars (FIG. 8A). Secondly, intra-layer dielectric 27 is deposited and planarized. Then the resistive layer 23 is deposited and etched using the resistive-layer mask of FIG. 7. Note that its dimension is nF (n>1, preferably ~2) (FIG. 8B). Finally, the upper address-line layer 20e is deposited (FIG. 8C) and etched using the intra-diode dielectric 27 as etch stop. This step will remove a portion of the resistive layer 23. As a result, the resistive layer 23 is self-aligned with the upper address line 20e (FIG. 4B). It should be apparent to those skilled in the art the preferred MPROM$_{RL}$ cells 1fa, 1ga in FIGS. 4C-4D can be manufactured in a similar manner.

From the above description, the final shape of the resistive layer 23 is determined by the overlapping portion between the resistive-layer pattern 7x and the upper-address-line pattern 20e. Hence, this self-aligned process relaxes the edge-control requirements on the resistive-layer patterns. In other words, a 20 nm-node 3D-MPROM$_{RL}$ can not only use a 40 nm resistive-layer mask, but also this mask can be a non-high-precision mask. Adding the fact that this self-aligned process also relaxes the alignment requirements between the upper address line and the resistive layer, the total lithographic cost for 3D-MPROM$_{RL}$ is relatively low.

Figure 9A:
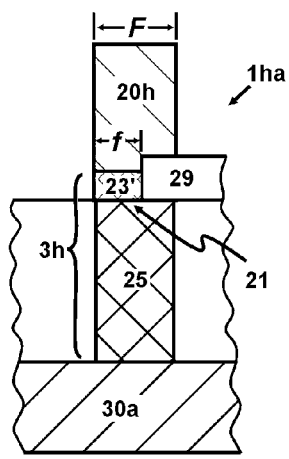
FIGS. 9A-9C are cross-sectional view of three preferred 3D-MPROM$_B$ cells with partial resistive layer (3D-MPROM$_{PRL}$)
Figure 9B:
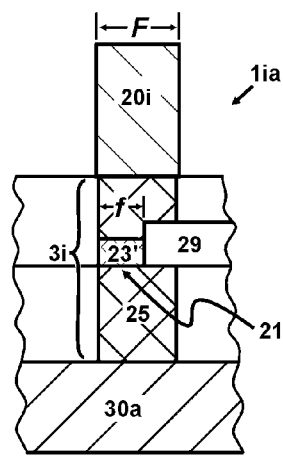
Figure 9C:
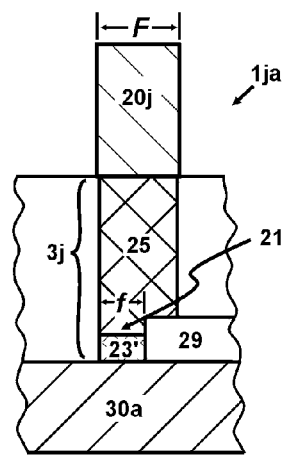

3D-MPROM$_{RL}$ can be combined with geometry-defined N-ary 3D-MPROM (referring to U.S. Pat. No. 7,633,128 and U.S. patent application Ser. No. 12/477,912). By varying the geometry of the resistive layer, more states can be created. Accordingly, the present invention discloses a 3D-MPROM with partial resistive layer (3D-MPROM$_{PRL}$). FIGS. 9A-9C illustrate three preferred 3D-MPROM$_{PRL}$ cells.

Referring now to FIG. 9A, a preferred 3D-MPROM$_{PRL}$ cell 1ha is illustrated. It comprises an upper address line 20h, a ROM-layer 3h and a lower address line 30a. The ROM-layer 3h further comprises a blocking dielectric 29, a partial resistive layer 23' and a quasi-conduction layer 25. The blocking dielectric 29 and the partial resistive layer 23' are formed above the quasi-conduction layer 25. The partial resistive layer 23' only partially couples the upper address line 20h to the quasi-conduction layer 25. Because the partial resistive layer 23' has a different geometry (i.e. smaller) than the resistive layer 23 of FIG. 4B, cell 1ha has a larger resistance than cell 1ea of FIG. 4B. To be more specific, the contact area 21 between the partial resistive layer 23' and the quasi-conduction layer 25 is smaller than the cross-sectional area of the quasi-conduction layer 25; whereas in FIG. 4B, the contact area between the resistive layer 23 and quasi-conduction layer 25 is comparable to the cross-sectional area of the quasi-conduction layer 25. By varying the width f of the contact area 21, more resistance values can be obtained and therefore, more states can be created. Because f is defined by resistive-layer patterns, a single resistive-layer mask can program more than one bit of data into each cell. Similarly, the partial resistive layer 23' preferably has a resistance comparable to or larger than the base cell 1za at $I_T$. It should be apparent to those skilled in the art that all concepts disclosed in U.S. Pat. No. 7,633,128 and U.S. patent application Ser. No. 12/477,912 can be used for 3D-MPROM$_{PRL}$.

Referring now to FIGS. 9B-9C, two alternate preferred 3D-MPROM$_{PRL}$ cells 1ia, 1ja are illustrated. They are similar to the 3D-MPROM$_{PRL}$ cell 1ha of FIG. 9A. The only difference is that their partial resistive layers 23' are either in or below the quasi-conduction layer 25. Similarly, by adjusting f, more resistance values can be obtained and therefore, more states can be created. A single resistive-layer mask can program more than one bit of data into each cell.

Figure 10:
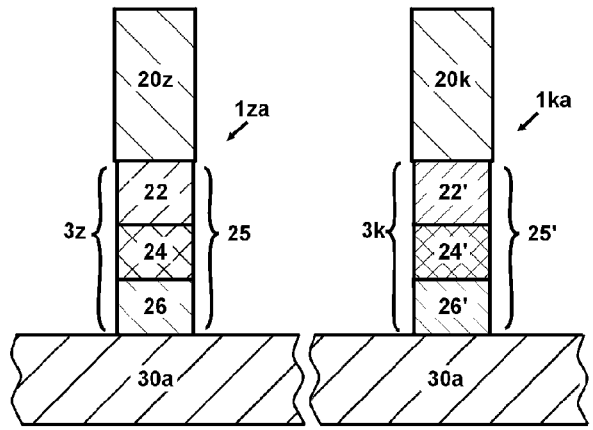
FIG. 10 is a cross-sectional view of a preferred 3D-MPROM$_B$ cell with resistive element (3D-MPROM$_{RE}$)

In a 3D-MPROM with resistive element (3D-MPROM$_{RE}$), the quasi-conduction layer of the memory cell comprises more concentration of at least one resistive element than the quasi-conduction layer of the base cell. Examples of 3D-MPROM$_{RE}$ are illustrated in FIGS. 10-12B. FIG. 10 illustrates a preferred 3D-MPROM$_{RE}$ cell 1ka. A base cell 1za is drawn to the left for comparison. The preferred 3D-MPROM$_{RE}$ cell 1ka comprises an upper address line 20k, a ROM-layer 3k and a lower address line 30a. The ROM-layer 3k comprises a quasi-conduction layer 25'. Although the quasi-conduction layer 25' is still a p-i-n diode 25', it comprises more concentration of at least one resistive element than diode 25 in the base cell 1za. The resistive element (e.g. oxygen, nitrogen, or carbon), when introduced into the semiconductor material (e.g. silicon) of the quasi-conductor layer (e.g. p-i-n diode) of the base cell 1za, can increase its resistivity. In addition, more concentration of the resistive element leads to a higher resistivity. This is opposite to the doping element (e.g. B, P, As) commonly used in semiconductor. The doping element decreases the semiconductor resistivity and more concentration of the doping element leads to lower resistivity.

Figure 11:
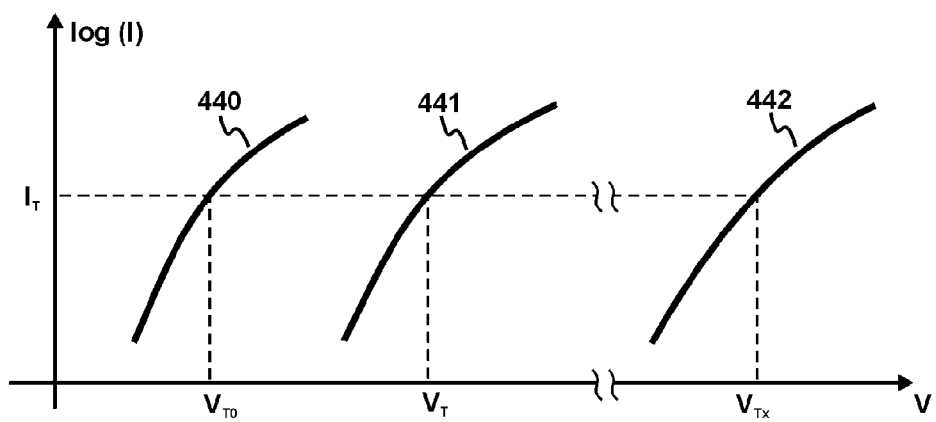
FIG. 11 compares the I-V curves for a Si-based diode, a $SiO_x$ (x<2)-based diode, and a $SiO_2$ layer.

FIG. 11 compares the I-V curves 440, 441, 442 for a Si-based diode (i.e. base cell), a $SiO_x$ (x<2)-based diode (i.e. 3D-MPROM$_{RE}$ cell), and a $SiO_2$ layer. Apparently, the I-V curve 441 for the $SiO_x$ (x<2)-based diode should be within the range defined by the I-V curve 440 for the silicon-based diode and the I-V curve 442 for the $SiO_2$ layer. This is because the $SiO_2$ layer can be considered as an extreme case of $SiO_x$ (x<2)-based diode, i.e. when the oxygen concentration becomes so high that $SiO_x$ (x<2) becomes $SiO_2$. Accordingly, $V_T$ of the $SiO_x$ (x<2)-based diode should be between $V_{T0}$ of the silicon-based diode and $V_{Tx}$ of the $SiO_2$ layer, i.e. $V_{T0} < V_T < V_{Tx}$. Because $V_{Tx}$ could be very large, $V_T$ of the 3D-MPROM$_{RE}$ cell can be modulated in a wide range. Similar to oxygen, nitrogen can modulate $V_T$ in a wide range. Alternatively, carbon can also be used to modulate $V_T$. This is because carbon, when incorporated into silicon, forms $SiC_z$ (z<1), which has a larger bandgap than silicon. In general, the larger the bandgap of the semiconductor material, a larger $V_T$ a diode has.

Figures 12A, 12B:
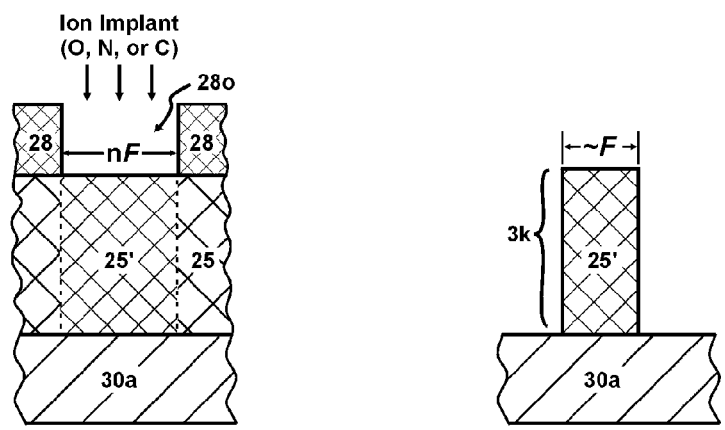
FIGS. 12A-12B illustrate several manufacturing steps of the preferred 3D-MPROM$_{RE}$ cell.

FIGS. 12A-12B illustrate two manufacturing steps for the preferred 3D-MPROM$_{RE}$ cell 1ka. First, the lower address-line 30a and the quasi-conduction layer 25 are formed. Then a resistive-element mask is used to form an opening 28o in the photoresist 28. The resistive-element mask is similar to the resistive-layer mask of FIG. 7. They are both nF-masks (n>1, preferably ~2). Here, the opening 28o has a width of nF (n>1, preferably ~2), larger than the upper address line 20k. This is followed by an ion implantation of resistive element (e.g. oxygen, nitrogen, carbon) (FIG. 12A). This ion-implantation step increases the concentration of the resistive element under the opening 28o. After ion implantation, the photoresist 28 is removed. Then the quasi-conduction layer 25 is patterned and etched to form a pillar 25'. The rest of manufacturing steps follows the steps described in FIGS. 8B-8C for the base cell 1za. Similar to 3D-MPROM$_{RL}$, a 20 nm-node 3D-MPROM$_{RE}$ can not only use a 40 nm resistive-element mask, but also this mask can be a non-high-precision mask. Overall, the data-programming cost for 3D-MPROM$_B$ is far lower than most people would like to believe.

Figure 14A:
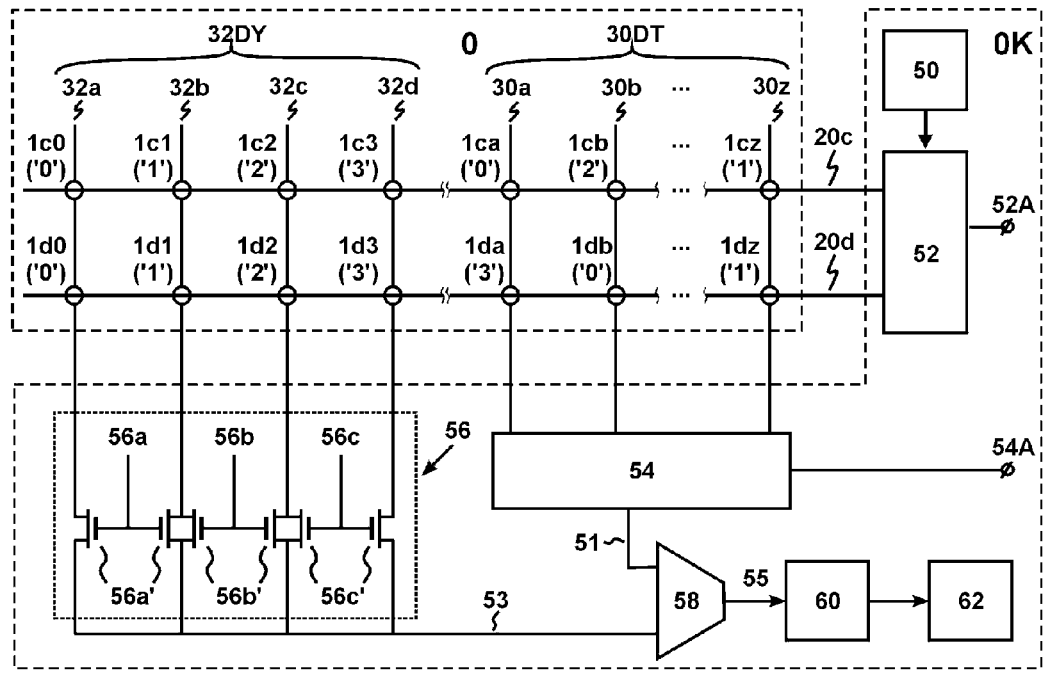
FIG. 14A is a circuit diagram of the preferred 2-bpc 3D-MPROM$_B$.
Figure 14B:
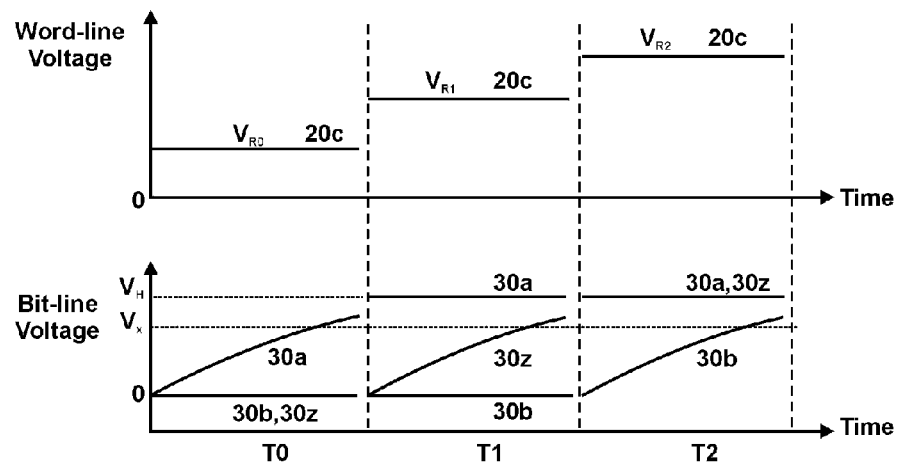
FIG. 14B is the timing diagram of a read operation for the preferred 2-bpc 3D-MPROM$_B$.
Figure 15B:
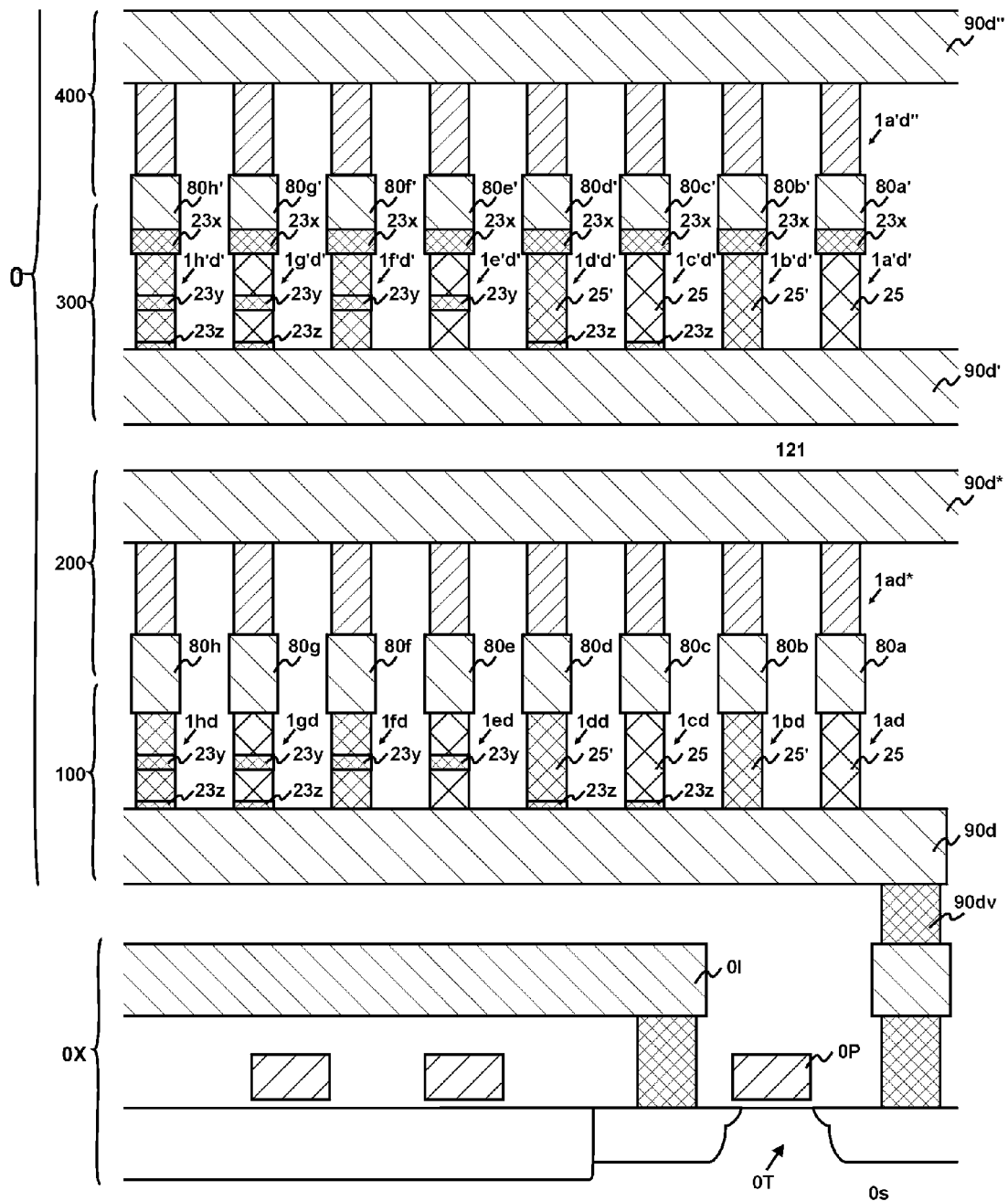
FIG. 15B is a cross-sectional view of the preferred 4-bpc 3D-MPROM$_B$.

3D-MPROM$_{RL}$ (FIGS. 4B-4D, FIGS. 9A-9C) and 3D-MPROM$_{RE}$ (FIG. 10) can be combined with geometry-defined N-ary 3D-MPROM and junction-defined N-ary 3D-MPROM (referring to U.S. Pat. No. 7,633,128 and U.S. patent application Ser. No. 12/477,912) to further increase the number of bits stored in each cell. FIGS. 13A-14B disclose several preferred 2-bpc 3D-MPROM$_B$ (b=2, N=4). FIGS. 15A-15B disclose a preferred 4-bpc 3D-MPROM$_B$ (b=4, N=16).

Figure 13A:
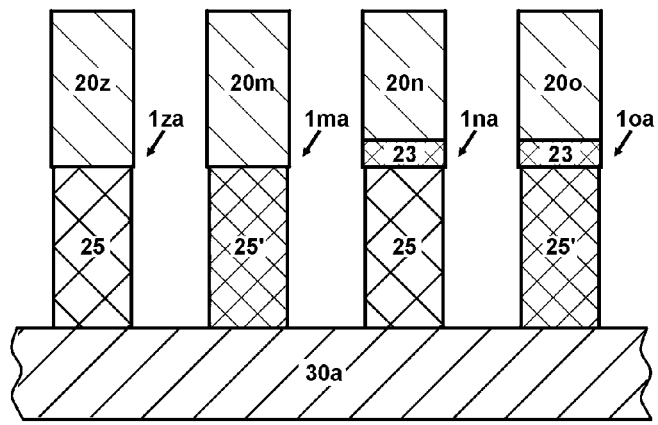
FIGS. 13A-13C are the cross-sectional views of three preferred 2-bpc 3D-MPROM$_B$'s (b=2, N=4)
Figure 13B:
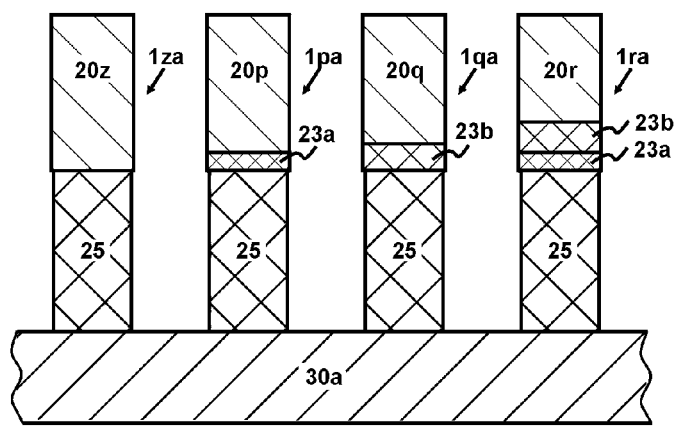
Figure 13C:
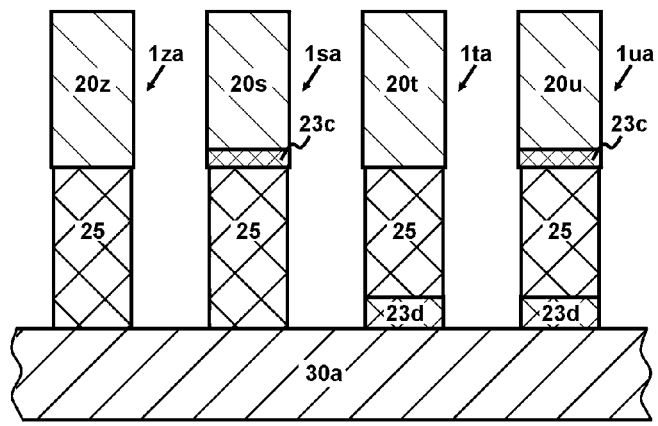

FIGS. 13A-13C illustrate three preferred 2-bpc 3D-MPROM$_B$'s. Referring now to FIG. 13A, a first preferred 2-bpc 3D-MPROM$_B$ is illustrated. It combines 3D-MPROM$_{RL}$ of FIG. 4B and 3D-MPROM$_{RE}$ of FIG. 10. The four cells 1za, 1ma, 1na, 1oa represent four different states. The base cell 1za comprises neither the resistive layer nor the resistive element. Cell 1ma comprises at least one resistive element in the quasi-conduction layer 25'. Cell 1na comprises a resistive layer 23 above the quasi-conduction layer 25. Cell 1oa comprises both resistive element and resistive layer. Alternatively, cell 1ma may have a different doping profile than the base cell 1za. Apparently, this preferred embodiment needs two masks (i.e. a resistive-layer mask and a resistive-element mask) to program two bits of data into each cell.

Referring now to FIG. 13B, a second preferred 2-bpc 3D-MPROM$_B$ is illustrated. It combines two preferred embodiments of 3D-MPROM$_{RL}$ in FIG. 4B. Four cells 1za, 1pa, 1qa, 1ra represent four different states. For example, the resistive layer 23a in cell 1pa comprises 15 nm amorphous silicon; the resistive layer 23b in cell 1qa comprises 30 nm amorphous silicon; the resistive layer in cell 1ra comprises both resistive layers 23a, 23b, i.e. 45 nm amorphous silicon. Alternatively, the resistive layer 23a in cell 1pa comprises 3 nm silicon nitride, the resistive layer 23b in cell 1qa comprises 6 nm silicon nitride; and the resistive layer in cell 1ra comprises 9 nm silicon nitride. Similarly, this preferred embodiment needs two masks (i.e. two resistive-layer masks) to program two bits of data into each cell.

Referring now to FIG. 13C, a third preferred 2-bpc 3D-MPROM$_B$ is illustrated. It combines two preferred embodiments of 3D-MPROM$_{RL}$ in FIGS. 4B and 4D. Four cells 1za, 1sa, 1ta, 1ua represent four different states. The resistive layer 23c in cell 1sa is formed above the quasi-conduction layer 25; the resistive layer 23d in cell 1ta is formed below the quasi-conduction layer 25; and cell 1ua comprises two resistive layers 23c, 23d, with resistive layer 23c above the quasi-conduction layer 25 and resistive layer 23d below the quasi-conduction layer 25. Similarly, this preferred embodiment needs two masks (i.e. two resistive-layer masks) to program two bits of data into each cell.

The read operation of 3D-MPROM$_B$ involves application of a sequence of read voltages with successively increasing magnitude. Once the read voltage is large enough to stimulate a read current for a memory cell, an output signal is generated and the corresponding read voltage indicates the state of the memory cell. FIGS. 14A-14B describe the peripheral circuit and read operation of the preferred 2-bpc 3D-MPROM$_B$.

FIG. 14A is a circuit diagram for the preferred 2-bpc 3D-MPROM$_B$. It comprises two blocks: a memory stack 0 and a peripheral circuit 0K. The memory stack 0 comprises a data group 30DT (including data cells 1ca-1cz and data bit lines 30a-30z) and a dummy group 32DY (including dummy cells 1c0-1c3 and dummy bit lines 32a-32d). The data cells store data, while the dummy cells provide a reference signal during read. Both data cells and dummy cells have four states '0'-'3', e.g. both data cell 1ca and dummy cell 1c1 are in state '1', as indicated by the numbers in the parentheses. It is advantageous that, for the same state, the dummy cells use the same structure and material as the data cells, because no extra manufacturing cost will incur for the dummy cells.

The peripheral circuit 0K is formed in the substrate 0s and coupled to the memory stack 0 through contact vias. It comprises a word-line voltage generation circuit 50, a row decoder 52, a column decoder 54, a reference-signal generation circuit 56, a sense amplifier 58, a data buffer 60 and an N-ary-to-binary converter 62. The word-line voltage generation circuit 50 generates a read voltage associated with the read phase. The row decoder 52 supply this read voltage to a word line (e.g. 20c) based on row address 52A. The column decoder 54 couples a bit line to a first input 51 of the sense amplifier 58 based on column address 54A. The reference-signal generation circuit 56 generates a reference voltage 53 as a second input for the sense amplifier 58. It comprises a plurality of switch pairs (e.g. 56a'), each of which includes a pair of transistors sharing a gate signal (e.g. 56a).

FIG. 14B is a timing diagram of the read operation. Each read operation includes at least N−1 read phases. This preferred embodiment has 3 read phases: T0-T2. During each read phase, a read voltage is applied to a selected word line (e.g. 20c). Based on the cell states, different read currents flow though memory cells (1ca-1cz, 1c0-1c3). Accordingly, the bit-line voltages (30a-30z, 32a-32d) rise at different rates. At the end of each read phase, all bit-line voltages in the data group 30DT are read out one-by-one. If the voltage on a bit line (e.g. 30a) is larger than a trigger voltage $V_x$, the output 55 becomes high. In the mean time, the sense amplifier 58 sets the voltage on the corresponding bit line (30a) to a high voltage $V_H$ in the remaining read phases. This can prevent diode in the associated cell (1ca) from being damaged when higher read voltages are applied during the remaining read phases. More details on each read phase are described below.

A) During the first read phase T0, a first read voltage $V_{R0}$ is applied to the word line 20c. Then the bit-line voltages (30a-30z, 32a-32d) rise at different rates based on the cell states. For state '0' (including cells 1ca, 1c0), the read voltage $V_{R0}$ generates a large read current and the bit-line voltages (30a, 32a) rise fast; for state '1' (including cells 1cz, 1c1), the read voltage $V_{R0}$ generates a small read current and the bit-line voltages (30z, 32b) stays almost flat . . . . In the mean time, only the gate signal 56a in the reference-signal generation circuit 56 is asserted. The switch pair 56a' is turned on and the dummy bit lines 32a, 32b are coupled together. As a result, the reference voltage 53 is effectively the average bit-line voltage for states '0' and '1'. At the end of T0, the bit-line voltages on all data bit lines (30a-30z) in the data group 30DT are compared one-by-one with the reference voltage 53 at the sense amplifier 58. The outputs 55 are sent to the data buffer 60.

B) During the second read phase T1, a second read voltage $V_{R1}$ is applied to the word line 20c. For state '0' (including cells 1ca, 1c0), the bit-line voltages (30a, 32a) are already set to $V_H$ during T0; for state '1' (including cells 1cz, 1c1), the read voltage $V_{R1}$ generates a large read current and the bit-line voltages (30z, 32b) rise fast; for state '2' (including cells 1cb, 1c2), the read voltage $V_{R1}$ generates a small read current and the bit-line voltages (30b 32c) stays almost flat . . . . In the mean time, only the gate signal 56b in the reference-signal generation circuit 56 is asserted and the reference voltage 53 is effectively the average bit-line voltage for states '1' and '2'. At the end of T1, the bit-line voltages on all data bit lines (30a-30z) are read out one-by-one and the outputs 55 are sent to the data buffer 60.

C) During the third read phase T2, a third read voltage $V_{R2}$ is applied to the word line 20c. For states '0' and '1' (including cells 1ca, 1cz, 1c0, 1c1), the bit-line voltages (30a, 30z, 32a, 32b) are already set to $V_H$ during T0 and T1; for state '2' (including cells 1cb, 1c2), the read voltage $V_{R2}$ generates a large read current and the bit-line voltages (30b, 32c) rise fast . . . . In the mean time, only the gate signal 56c in the reference-signal generation circuit 56 is asserted and the reference voltage 53 is effectively the average bit-line voltage for states '2' and '3'. At the end of T2, the bit-line voltages on all data bit lines (30a-30z) are read out one-by-one and the outputs 55 are sent to the data buffer 60.

D) At the end of the read operation, all data stored in the data buffer 60 are converted into binary data by the N-ary-to-binary converter 62. Hence, the 4-ary data stored at cells 1ca-1cz are read out.

FIGS. 15A-15B illustrate a preferred 4-bpc 3D-MPROM$_B$. FIG. 15A is a table listing the configuration for its 16 states and FIG. 15B is its cross-sectional view. It should be apparent to those skilled in the art that the peripheral circuit and read operation in FIGS. 14A-14B for the 2-bpc 3D-MPROM$_B$ can be applied to the 4-bpc 3D-MPROM$_B$.

Referring now to FIG. 15A, to achieve 4-bpc, memory cells are modified in four dimensions: upper resistive layer 23x, middle resistive layer 23y, lower resistive layer 23z and resistive element. "Yes" in the table means inclusion of resistive layer or resistive element; "No" means otherwise. Binary choices ("Yes" or "No") in each of these four dimensions lead to 16 different states. Here, these four dimensions can be realized by four masks, i.e. upper resistive-layer mask, middle resistive-layer mask, lower resistive-layer mask, and resistive-element mask.

Referring now to FIG. 15B, the preferred 4-bpc 3D-MPROM$_B$ comprises a semiconductor substrate 0s and a 3D-MPROM$_B$ stack 0. The semiconductor substrate 0s comprises transistors 0T (including gate 0P), which, together with interconnects 0I, form a peripheral circuit 0X for the 3D-MPROM$_B$ stack 0. The 3D-MPROM$_B$ stack 0 is stacked above the substrate 0s. In this preferred embodiment, it comprises four memory levels: 100-400: the memory level 100 comprises word lines (80a-80h . . . ), bit lines (90d . . . ) and memory cells (1ad-1hd . . . ); the memory level 200 is stacked above the memory level 100 and comprises word lines (80a-80h . . . ), bit lines (90d* . . . ) and memory cells (1ad* . . . ); the memory level 300 is stacked above the memory level 200 and comprises word lines (80a'-80h' . . . ), bit lines (90d' . . . ) and memory cells (1a'd'-1h'd' . . . ); the memory level 400 is stacked above the memory level 300 and comprises word lines (80a'-80h' . . . ), bit lines (90d'' . . . ) and memory cells (1a'd''' . . . ). Contact vias (e.g. 90dv) couple memory levels (e.g. 100) to the substrate 0s.

Memory cells 1ad-1hd and 1a'd'-1h'd' in memory levels 100, 300 represent states '0'-'f', respectively (also referring to FIG. 15A). For example, memory cell 1ad represents state '0'. It is the base cell and comprises neither resistive layer nor resistive element; memory cell 1bd represents state '1' and comprises at least one resistive element in diode 25'; memory cell 1cd represents state '2' and comprises a lower resistive layer 23z; memory cell 1ed represents state '4' and comprises a middle resistive layer 23y; memory cell 1a'd' represents state '8' and comprises an upper resistive layer 23x; memory cell 1h'd' represents state 'f' and comprises the upper resistive layers 23*x*, the middle resistive layers 23*y*, the lower resistive layers 23*z* and at least one resistive element. For reason of simplicity, memory cells in memory levels 200, 400 and contact vias for memory levels 200-400 are not drawn in this figure.

The preferred embodiment in FIG. 15B incorporates several advanced features for 3D-MPROM, including hybrid-level 3D-MPROM (referring to U.S. patent application Ser. No. 12/476,263, filed by Zhang on Jun. 2, 2009) and small-pitch 3D-MPROM (referring to U.S. patent application Ser. No. 11/936,069, filed by Zhang on Nov. 6, 2007). Hybrid-level 3D-MPROM refers to a 3D-MPROM where a portion of memory levels (e.g. 100, 200) share one level of address lines (e.g. 80*a*-80*h* . . . ), while another portion of memory levels (e.g. 200, 300) are separated by an inter-level dielectric 121. Small-pitch 3D-MPROM refers to a 3D-MPROM whose address-line pitch is smaller than the transistor-gate pitch. Further combining three-dimension memory module (referring to U.S. patent application Ser. No. 12/043,128, filed by Zhang on Mar. 5, 2008), a ×8×8×4 3D-MPROM$_B$ module (i.e. 8 3D-MPROM$_B$ chips stacked in a module, 8 memory levels and 4-bpc in a 3D-MPROM$_B$ chip) can reach a capacity of ~1TB at the 20 nm node.

In FIGS. 13A-13C, only two masks are needed to program two bits of data into each cell and realize 2-bpc; in FIGS. 15A-15B, only four masks are needed to program four bits of data into each cell and realize 4-bpc. In fact, in 3D-MPROM$_B$, each mask can program one additional bit into memory cell. For example, five masks can realize 5-bpc; six masks can realize 6-bpc . . . . If 3D-MPROM$_{PRL}$ of FIGS. 9A-9C is used, even fewer masks are needed. This is more advantageous than the prior-art binary 3D-MPROM, which needs one more memory level for each additional bit.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A three-dimensional mask-programmable read-only memory including a plurality of mask-programmable read-only memory levels stacked above and coupled to a semiconductor substrate, comprising:
   a first memory cell comprising a first quasi-conduction layer;
   a second memory cell comprising a second quasi-conduction layer and a resistive layer, wherein said resistive layer is not an insulating layer;
   a third memory cell comprising a third quasi-conduction layer different from said first quasi-conduction layer;
   wherein said first, second and third memory cells have different current-voltage characteristics.

2. The three-dimensional mask-programmable read-only memory according to claim 1, wherein said third quasi-conduction layer comprises more concentration of at least one resistive element than said first quasi-conduction layer.

3. The three-dimensional mask-programmable read-only memory according to claim 2, wherein said resistive element increases the resistance of said third quasi-conduction layer.

4. The three-dimensional mask-programmable read-only memory according to claim 2, wherein said resistive element is selected from a group of elements consisting of oxygen, nitrogen and carbon.

5. The three-dimensional mask-programmable read-only memory according to claim 1, wherein said resistive layer has a resistance comparable to said second quasi-conduction layer.

6. A three-dimensional mask-programmable read-only memory including a plurality of mask-programmable read-only memory levels stacked above and coupled to a semiconductor substrate, comprising:
   a first memory cell comprising a first quasi-conduction layer;
   a second memory cell comprising a second quasi-conduction layer and a resistive layer, wherein said resistive layer has a resistance comparable to said second quasi-conduction layer;
   a third memory cell comprising a third quasi-conduction layer different from said first quasi-conduction layer;
   wherein said first, second and third memory cells have different current-voltage characteristics.

7. The three-dimensional mask-programmable read-only memory according to claim 6, wherein said third quasi-conduction layer comprises more concentration of at least one resistive element than said first quasi-conduction layer.

8. The three-dimensional mask-programmable read-only memory according to claim 7, wherein said resistive element increases the resistance of said third quasi-conduction layer.

9. The three-dimensional mask-programmable read-only memory according to claim 7, wherein said resistive element is selected from a group of elements consisting of oxygen, nitrogen and carbon.

10. The three-dimensional mask-programmable read-only memory according to claim 6, wherein said resistive layer is not an insulating layer.

* * * * *